United States Patent
Chu

(12) United States Patent (10) Patent No.: US 6,449,157 B1
Chu (45) Date of Patent: Sep. 10, 2002

(54) IC PACKAGE ASSEMBLY WITH RETENTION MECHANISM

(76) Inventor: Ho Kang Chu, 22928 Estoril Dr. #5, Diamond Bar, CA (US) 91765

( * ) Notice: Subject to any disclaimer, the term of this patent is extended or adjusted under 35 U.S.C. 154(b) by 0 days.

(21) Appl. No.: 09/970,662

(22) Filed: Oct. 3, 2001

(51) Int. Cl.[7] .................................................. H05K 7/20
(52) U.S. Cl. ...................... 361/704; 361/690; 361/697; 361/719; 174/16.3; 257/718; 257/719; 257/722; 257/727; 165/80.3; 165/185; 24/458; 24/520; 411/516; 411/522; 411/523; 411/520
(58) Field of Search .......................... 361/702–704, 361/707, 709, 717–719; 165/80.3, 185; 257/706, 717–719, 722, 727; 174/16.3; 248/316.7, 510; 24/457, 520; 411/516, 522, 523

(56) References Cited

U.S. PATENT DOCUMENTS

| | | | | |
|---|---|---|---|---|
| 4,509,839 A | * | 4/1985 | Lavochkin | .................. 257/718 |
| 5,251,101 A | * | 10/1993 | Liu | ............................. 361/717 |
| 5,448,449 A | * | 9/1995 | Bright et al. | ................ 361/704 |
| 5,493,475 A | * | 2/1996 | Lin | ............................. 361/710 |
| 5,808,236 A | * | 9/1998 | Brezina et al. | ............. 174/16.3 |
| 5,835,347 A | * | 11/1998 | Chu | ........................... 361/697 |
| 6,181,567 B1 | * | 1/2001 | Roemer et al. | ............. 361/760 |
| 6,205,026 B1 | * | 3/2001 | Wong et al. | ................. 361/704 |

* cited by examiner

Primary Examiner—Boris Chervinsky

(57) ABSTRACT

A retention mechanism (6, 6') for an LGA package assembly (1, 1') consists of a spring clip (60, 60') and a lever (62, 62') both attached to a heat sink (5, 5'). The spring clip has a biasing strip (612, 612') and a pair of opposite engaging legs (610, 610'). The lever includes an arcuate section (680, 680') positioned beneath the biasing strip, whereby the lever is rotatable from a vertical position where the arcuate section is contained in a plane parallel with the biasing strip to a horizontal position where the arcuate section is contained in a plane perpendicular to the biasing strip and engages with the biasing strip. When the lever is rotated to the horizontal position, the biasing strip is biased upwardly to cause the engaging legs to abut against a bottom surface (22) of a PCB (2), whereby the components of the LGA package assembly are mechanically and electrically connected to one another.

23 Claims, 12 Drawing Sheets

ABIDnumberedUS 6,449,157 B1

IC PACKAGE ASSEMBLY WITH RETENTION MECHANISM

BACKGROUND OF THE INVENTION

1. Field of the Invention

The present invention relates to an IC (Integrated Circuit) package assembly, and particularly to an LGA (Land Grid Array) package assembly having a retention mechanism for mechanically and electrically securing the components of the LGA package assembly to one another.

2. Description of Prior Art

IC packages having leads arranged in a land grid array (LGA) are well known as LGA packages. Connectors for removably mounting an LGA package on a PCB (Printed Circuit Board) are known as LGA sockets. An LGA socket comprises a substantially flat insulative housing defining an array of passageways with electrical contacts received therein corresponding with the array of leads of the LGA package. Each contact has a pair of free ends oppositely projecting beyond external surfaces of the socket housing for respectively engaging with corresponding contact pads on a bottom surface of the LGA package and on a top surface of the PCB. To dissipate the heat generated by an IC chip incorporated in the LGA package, a heat sink is commonly applied.

Different methods are disclosed by the prior art for clamping the LGA package, the LGA socket and the PCB together, thereby establishing an electrical connection between the contacts of the LGA socket and corresponding contact pads of the LGA package and the PCB. U.S. Pat. No. 4,906,194 discloses an LGA package assembly consisting of an upper support plate, an LGA package, an LGA socket, a PCB, an insulator, and a lower support plate. The components of the LGA package assembly are fastened to each other by a plurality of threaded screw members sequentially extending through bores defined in each component, which is laborious and tedious. U.S. Pat. No. 5,847,928 discloses another LGA package assembly consisting of a heat sink, an LGA package, an LGA socket and a PCB. The components are fastened together by a clip disposed on a bottom side of the PCB which has two upwardly extending arms inserted in aligned apertures of the PCB and the heat sink. One problem with this design is that the retention force of the clip for fastening the components of the assembly together is not sufficient enough to prevent physical separation therebetween when the assembly is subject to external shock and vibration. Such a physical separation may result in broken circuits between the LGA package and the PCB, thereby adversely affecting the operation of the LGA package assembly.

Hence, an improved LGA package assembly is desired to overcome the aforesaid disadvantages of the prior art.

SUMMARY OF THE INVENTION

Accordingly, one object of the present invention is to provide an LGA package assembly having a retention mechanism for securely connecting components thereof to one another.

Another object of the present invention is to provide a retention mechanism for an LGA package assembly for reliably connecting an LGA package to a PCB.

A further object of the present invention is to provide a retention mechanism for an LGA package assembly which is easy to assemble and disassemble.

In order to achieve the objects set forth, an LGA package assembly in accordance with the present invention comprises a PCB, a socket mounted on the PCB, an LGA package coupled to the socket, a heat sink positioned on the LGA package, and a retention mechanism for mechanically and electrically assembling the above components together. Preferably, a metal support plate may be attached to a bottom surface of the PCB for strengthening the PCB, and an elastomer may be sandwiched between the heat sink and the LGA package and also between the PCB and the support plate.

The retention mechanism consists of a spring clip and a lever. The spring clip has a biasing strip attached to a planar substrate of the heat sink and substantially parallel with the substrate, and a pair of engaging legs on opposite ends of the biasing strip, each engaging leg having an engaging toe horizontally extending from a free end thereof. The lever includes an actuation beam attached to the heat sink and extending in a direction perpendicular to the biasing strip of the spring clip. An arcuate section is formed on the actuation beam and is positioned beneath the biasing strip of the spring clip, whereby the lever is rotatable from a vertical position where the arcuate section is contained in a plane parallel with the biasing strip of the spring clip to a horizontal position where the arcuate section is contained in a plane perpendicular to the biasing strip of the spring clip and engages with the biasing strip of the spring clip.

When the lever is rotated to the horizontal position to engage with the biasing strip of the spring clip, the biasing strip is biased upwardly to cause the engaging toes of the spring clip to abut against the bottom surface of the PCB or the support plate, whereby the heat sink is securely attached to the PCB and whereby a reliable electrical connection is established between oppositely projecting contact portions of contacts of the socket and corresponding contact pads on a bottom surface of the LGA package and on a top surface of the PCB.

Other objects, advantages and novel features of the invention will become more apparent from the following detailed description when taken in conjunction with the accompanying drawings.

DETAILED DESCRIPTION OF PREFERRED EMBODIMENTS

Figure 1:
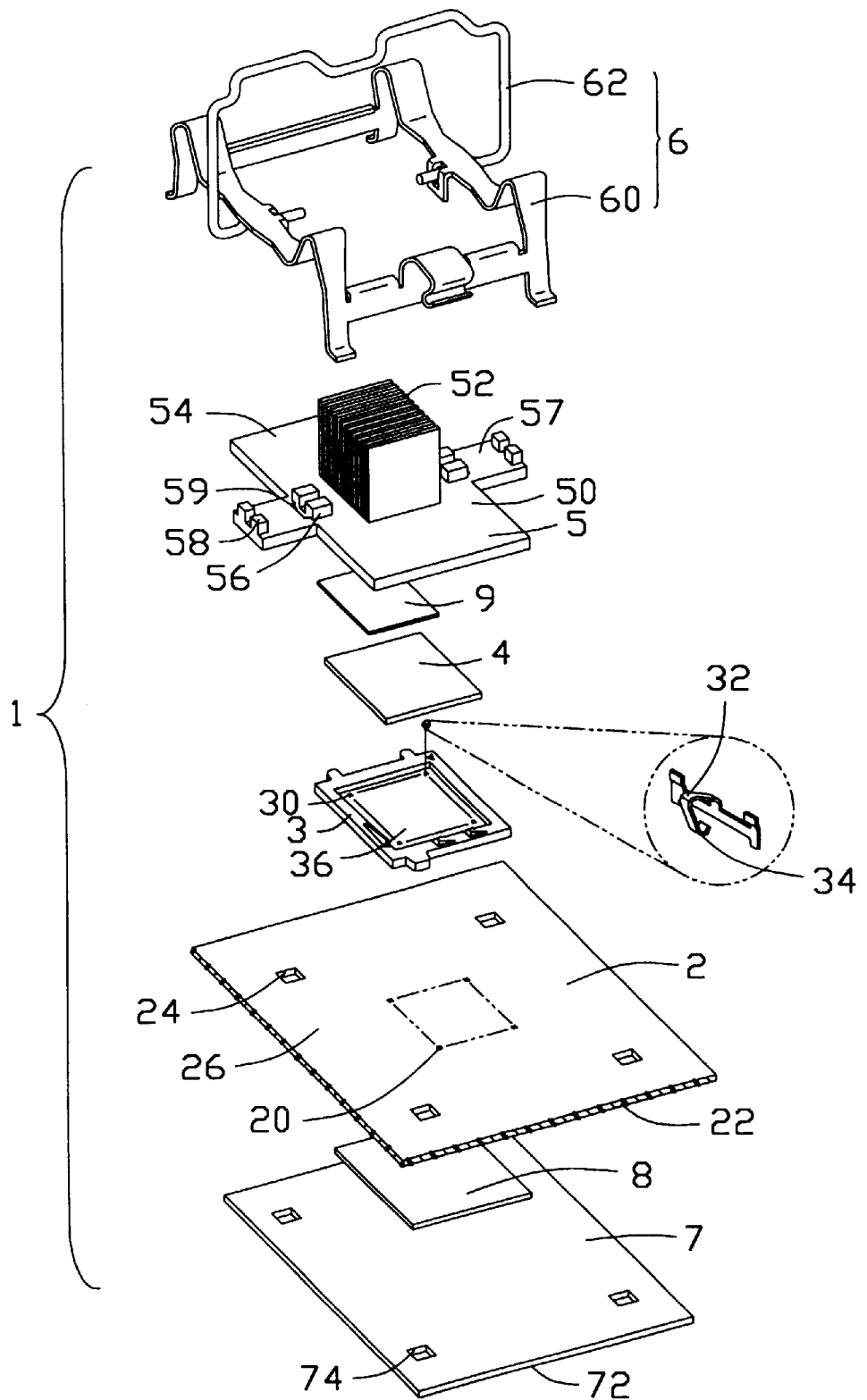
FIG. 1 is an exploded, perspective view of an LGA package assembly in accordance with a first embodiment of the present invention.

For facilitating understanding, like components are designated by like reference numerals throughout the various embodiments of the invention as shown in the various drawing figures.

Reference will now be made to the drawing figures to describe the present invention in detail.

Referring to FIG. 1, an LGA package assembly 1 in accordance with a first embodiment of the present invention comprises a PCB 2, an LGA socket 3 for being mounted on the PCB 2, an LGA package 4 with an LGA chip (not shown) incorporated therein for being received in the LGA socket 3, a heat sink 5 for dissipating heat generated by the LGA chip of the LGA package 4, and a retention mechanism 6 consisting of a spring clip 60 and a lever 62 for attaching the heat sink 5 to the LGA package 4 and for reliably connecting the LGA package 4 with the PCB 2 via the LGA socket 3. Preferably, a metal support plate 7 may be positioned below the PCB 2 for strengthening the PCB 2. Elastomers 8 and 9 may be respectively placed between the PCB 2 and the support plate 7 and between the heat sink 5 and the LGA package 4 to prevent separation therebetween under shock and vibration. Additionally, the elastomers 8 and 9 act as a strain-relief by uniformly distributing forces exerted on the LGA package 4 and the PCB 2 along the area of contact with the respective LGA package 4 and the PCB 2.

The LGA package 4 comprises a plurality of contact pads (not shown) on a bottom surface thereof arranged in an array corresponding to leads (not shown) of the LGA chip incorporated therein. Corresponding to the contact pads of the LGA package, a plurality of contact pads 20 is also provided on a top surface 26 of the PCB 2. To interconnect the LGA package 4 with the PCB 2, the LGA socket 3 retains a plurality of contacts 30 therein each having oppositely projecting contact portions 32 and 34 for respectively connecting with corresponding contact pads of the LGA package 4 and the PCB 2. A rectangular cavity 36 is defined in the LGA socket 3 for receiving the LGA package 4 therein.

The heat sink 5 includes a planar substrate 50 to be positioned on the LGA package 4 and a plurality of heat dissipating fins 52 upwardly extending from the substrate 50. A first pair of spaced protrusions 56 is formed on a top surface 54 of the substrate 50 proximate each lateral side of the substrate 50. The substrate 50 further includes a pair of wings 57 respectively extending outward from opposite lateral sides thereof. Each wing 57 forms a second pair of spaced protrusions 58 proximate a free end thereof. The second pair of protrusions 58 is spaced a distance equal to that between the first pair of protrusions 56. An engaging aperture 59 is defined in the substrate 50 between the first and second pairs of protrusions 56 and 58 and proximate the first pair of protrusions 56.

Figure 2:
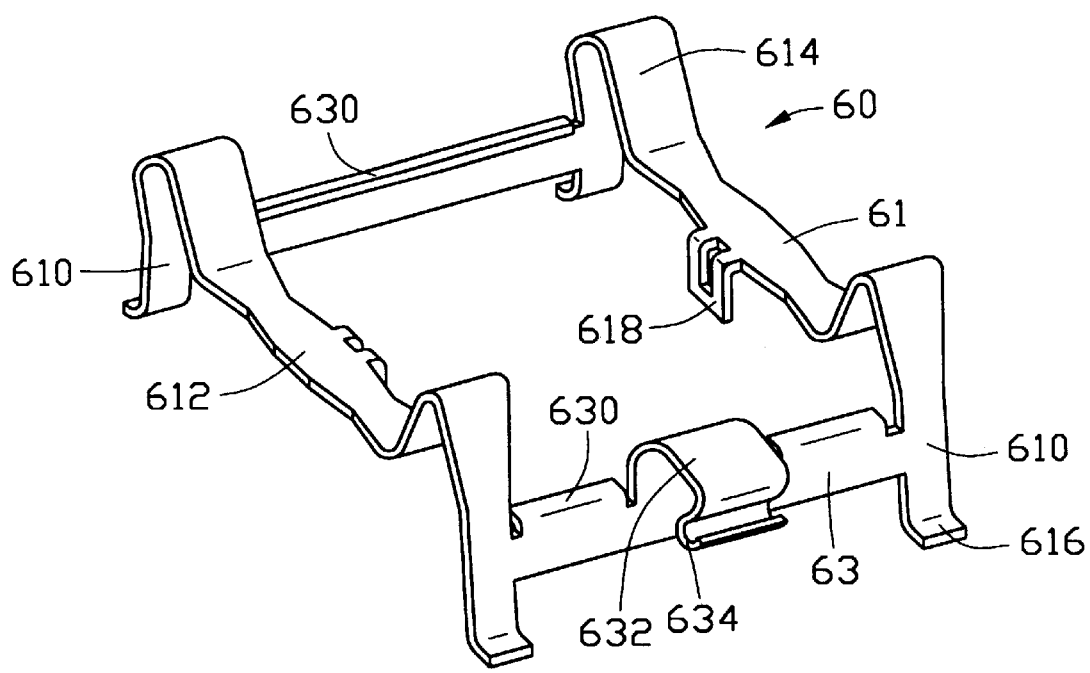
FIG. 2 is a perspective view of a spring clip shown in FIG. 1.

As is clearly shown in FIG. 2, the spring clip 60 of the retention mechanism 6 is integrally formed by stamping and bending a metal sheet. The spring clip 60 includes a pair of parallel, laterally extending spring members 61 which are maintained in spaced-apart relation by a pair of integral, longitudinally extending bridges 63. Each spring member 61 includes a pair of engaging legs 610, a biasing strip 612 between the engaging legs 610, and a pair of opposed bent portions 614 interconnecting the engaging legs 610 with adjacent ends of the biasing strip 612. Each bent portion 614 has a reversed U-shape for providing the spring member 61 with resiliency. The pair of engaging legs 610 of each spring member 61 has a pair of respective engaging toes 616 extending away from each other. The biasing strip 612 has a yoke 618 downwardly extending from an inner edge thereof. The bridges 63 comprise a pair of respective flanges 630 extending from upper edges thereof toward each other. One of the bridges 63 further includes an outwardly extending catch 632 forming an inwardly directed hook 634 at a free end thereof, whereby the corresponding flange 630 is divided into two sections.

Figure 3:
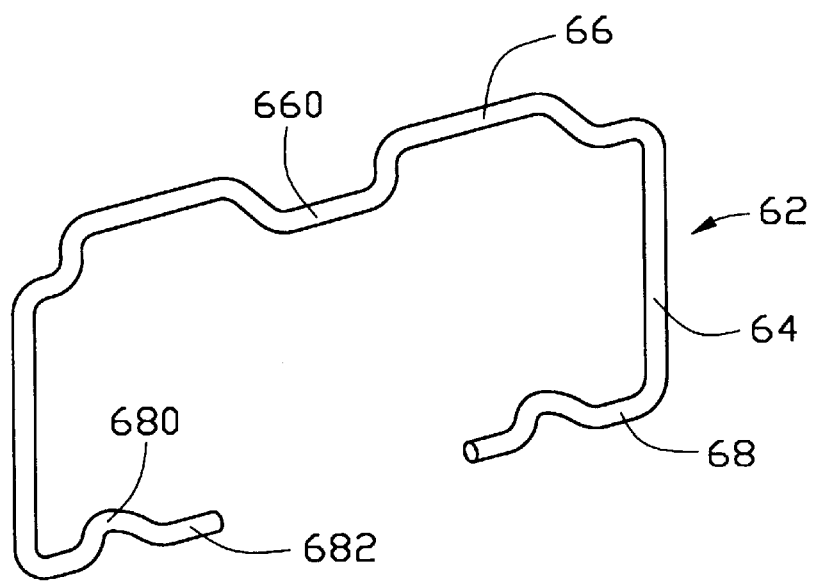
FIG. 3 is a perspective view of a lever shown in FIG. 1.

Referring to FIG. 3, the lever 62 of the retention mechanism 6 is adapted to be used in cooperation with the spring clip 60. Correspondingly, the lever 62 includes a pair of opposite lateral beams 64, a handling beam 66 interconnecting the lateral beams 64, and a pair of actuation beams 68 extending from respective free ends of the lateral beams 64 toward each other. The handling beam 66 has a U-shaped latch 660 contained in a plane perpendicular to the lateral beams 64 for resting on the hook 634 of the catch 632 of the spring clip 60. Each actuation beam 68 includes an arcuate section 680 contained in a plane parallel with that of the U-shaped latch 660, and a horizontal free end section 682 for extending through the yoke 618 of the spring clip 60.

Figure 4:
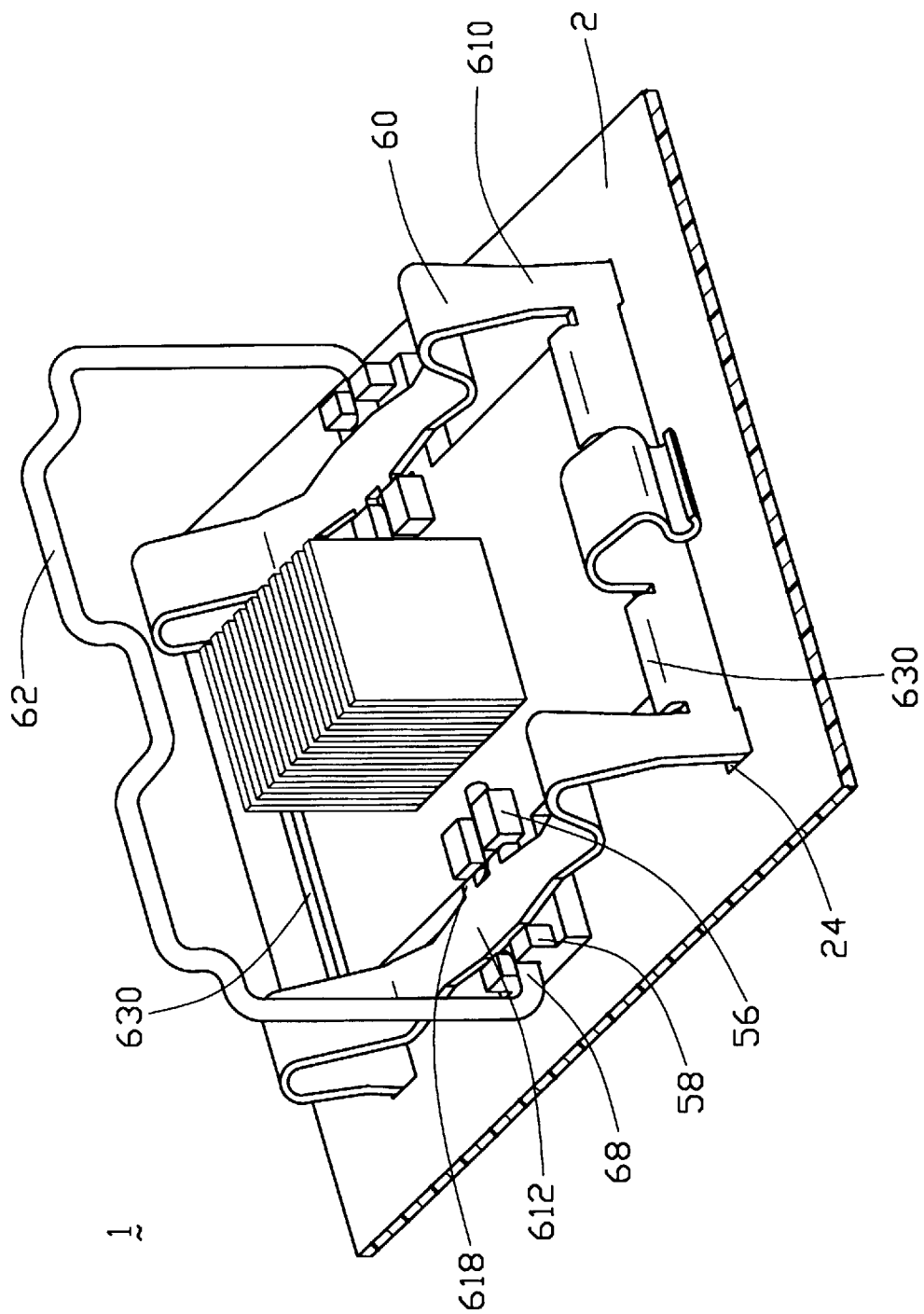
FIG. 4 is an assembled view of the LGA package assembly of FIG. 1 with the lever in a vertical position where the LGA package assembly is in an unlocked position.

In assembly, as is illustrated in FIG. 4, the LGA package 4 is received in the rectangular cavity 36 of the LGA socket 3. The assembled LGA package 4 and socket 3 are then mounted on the PCB 2, and the heat sink 5 is lowered onto the LGA package 4 with the elastomer 9 sandwiched therebetween. The support plate 7 is attached to a bottom surface 22 of the PCB 2 with the elastomer 8 sandwiched therebetween. The spring clip 60 and the lever 62 of the retention mechanism 6 are then assembled together with the actuation beams 68 of the lever 62 positioned below the biasing strips 612 of the spring clip 60 and with the free end sections 682 of the actuation beams 68 of the lever 62 extending into corresponding yokes 618 of the spring clip 60. The assembled retention mechanism 6 is finally attached to the heat sink 5 with the lever 62 in a vertical position where the arcuate sections 680 of the lever 62 are contained in a horizontal plane parallel with the substrate 50 of the heat sink 5. The actuation beams 68 of the lever 62 are retained by the first and second pairs of spaced protrusions 56 and 58 of the heat sink 5 and the arcuate sections 680 are received in a space defined between the first and second pairs of the protrusions 56 and 58, whereby lateral and longitudinal movements of the actuation beams 68 are prevented. The yokes 618 of the spring clip 60 are partially inserted into corresponding engaging apertures 59 of the substrate 50 with the inserted free end sections 682 of the actuation beams 68 of the lever 62 extending therethrough. The flanges 630 of the bridges 63 abut against the top surface 54 of the substrate 50, and the engaging legs 610 of the spring clip 60 sequentially extend into aligned holes 24 and 74 (only three visible) respectively defined in the PCB 2 and the support plate 7.

Figure 5:
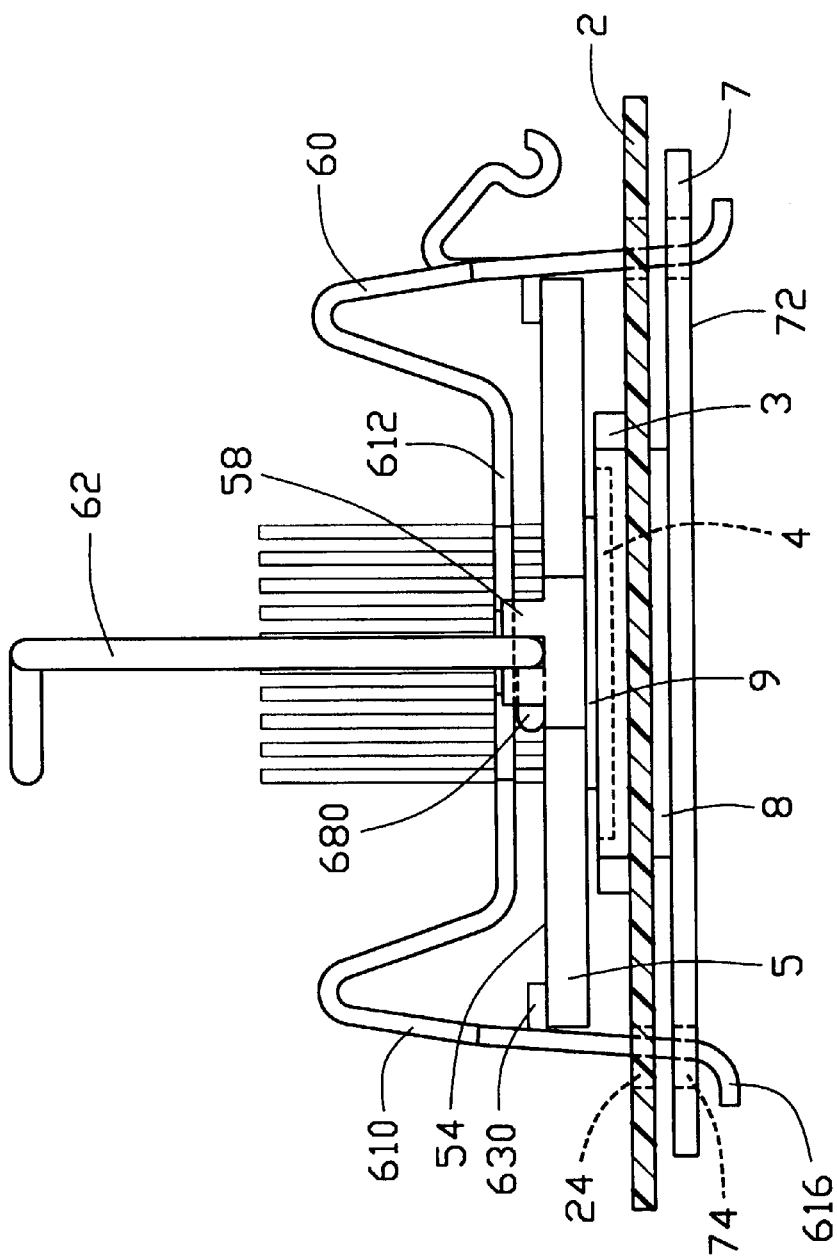
FIG. 5 is a front view of FIG. 4.

FIGS. 4 and 5 show an assembled view of the LGA package assembly 1 of the first embodiment in an unlocked position where the lever 62 is retained in a vertical position. In this unlocked position, the arcuate sections 680 of the actuation beams 68 of the lever 62 are contained in a plane parallel with the biasing strips 612 of the spring clip 60, and the engaging toes 616 of the engaging legs 610 of the spring clip 60 project beyond the bottom surface 72 of the support plate 7, whereby the opposite contact portions 32 and 34 of the contacts 30 of the LGA socket 3 are not brought into reliable electrical connection with corresponding contact pads of the LGA package 4 and the PCB 2.

Figure 6:
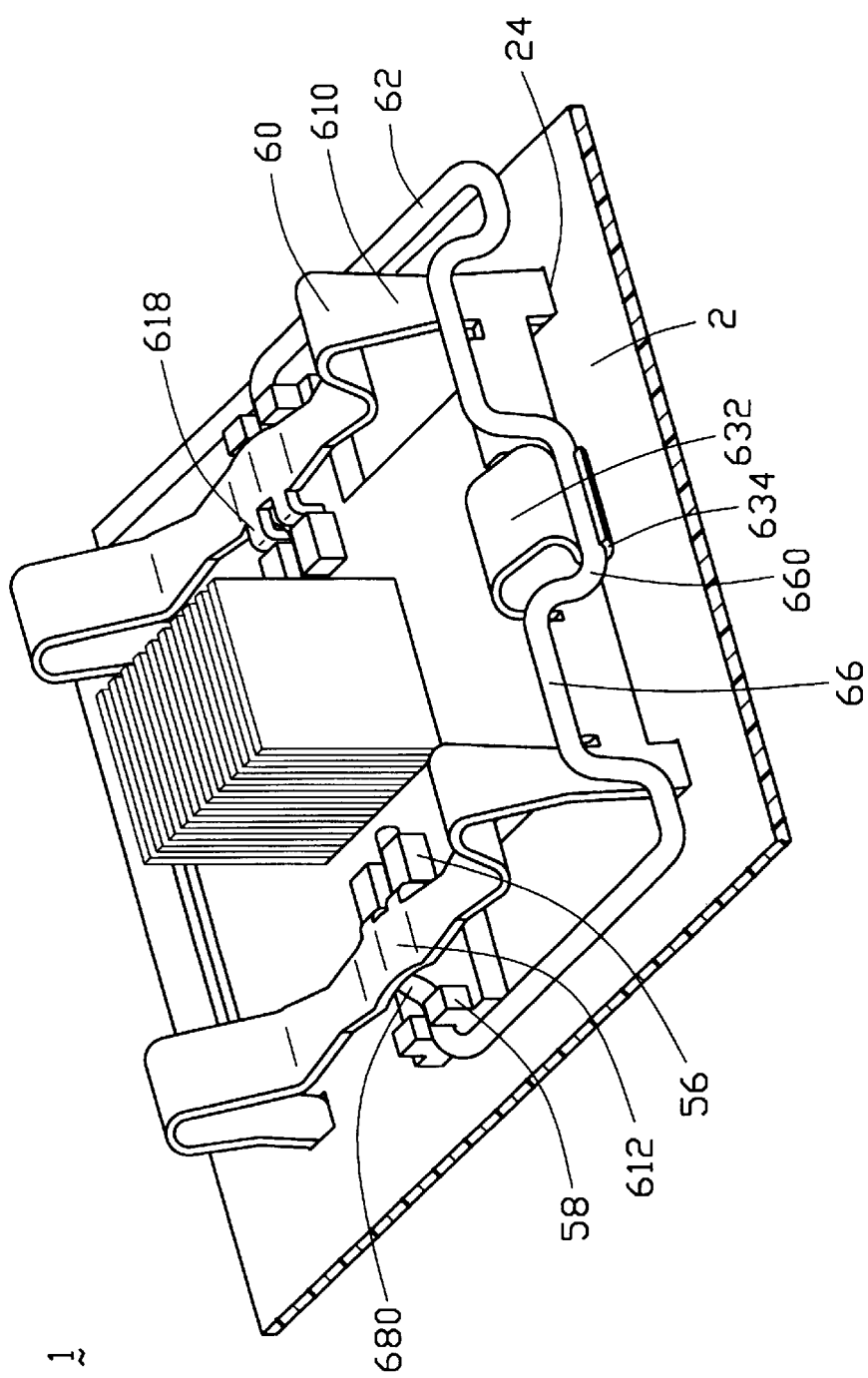
FIG. 6 is an assembled view of the LGA package assembly of FIG. 1 with the lever in a horizontal position where the LGA package assembly is in a locked position.
Figure 7:
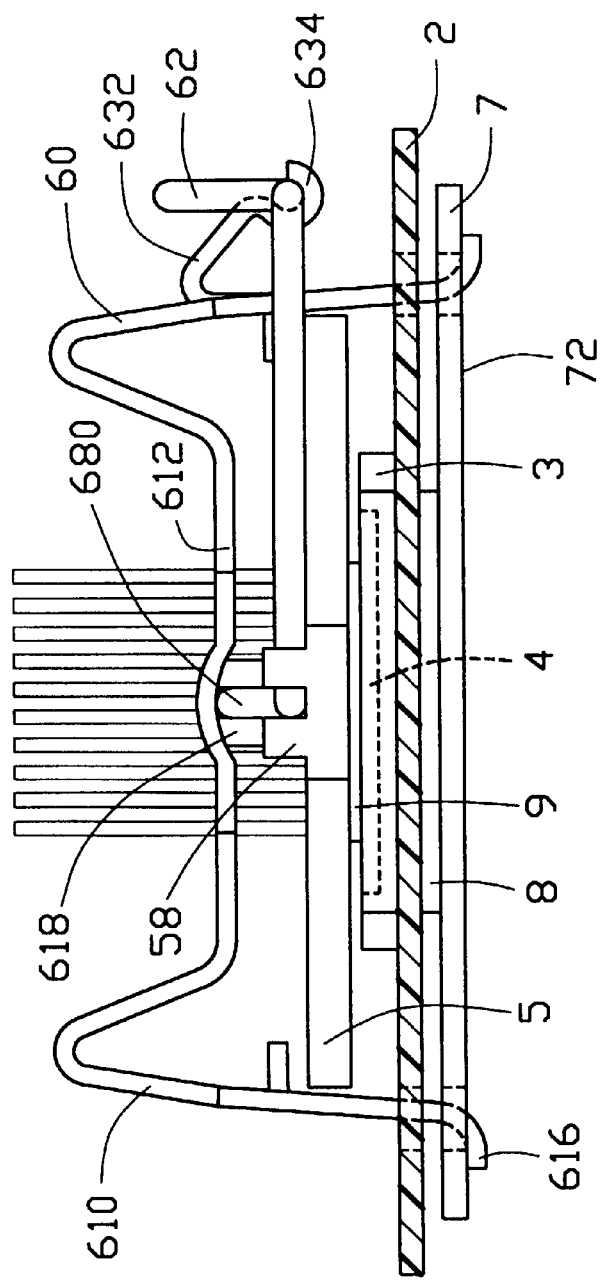
FIG. 7 is a front view of FIG. 6.

FIGS. 6 and 7 show an assembled view of the LGA package assembly 1 of the first embodiment in a locked position where the lever 62 is rotated from the vertical position shown in FIGS. 4 and 5 to a horizontal position. During the rotation process of the lever 62, the yokes 618 of the spring clip 60 are vertically movable in the corresponding engaging apertures 59. In the locked position, the arcuate sections 680 of the actuation beams 68 of the lever 62 are contained in a plane perpendicular to the biasing strips 612 of the spring clip 60 and engage with the biasing strips 612, whereby the biasing strips 612 are biased upwardly to cause the engaging toes 616 of the engaging legs 610 to abut against the bottom surface 72 of the support plate 7. Consequently, a spring force is exerted by the spring clips 60 on the heat sink 5 via the actuation beams 68 of the lever 62, which is further transferred by the heat sink 5 to the LGA package 4, the LGA socket 3 and the PCB 2, thereby pressing the opposite contact portions 32 and 34 of the contacts 30 of the LGA socket 3 into reliable electrical connection with corresponding contact pads of the LGA package 4 and the PCB 2.

An LGA package assembly 1' in accordance with a second embodiment of the present invention is illustrated in FIGS. 8–14. The configuration of the second embodiment is similar to that of the first embodiment except for the retention mechanism 6' and the heat sink 5'. Therefore, only the retention mechanism 6' and the heat sink 5' of the second embodiment will be described in detail hereinafter.

Figure 9:
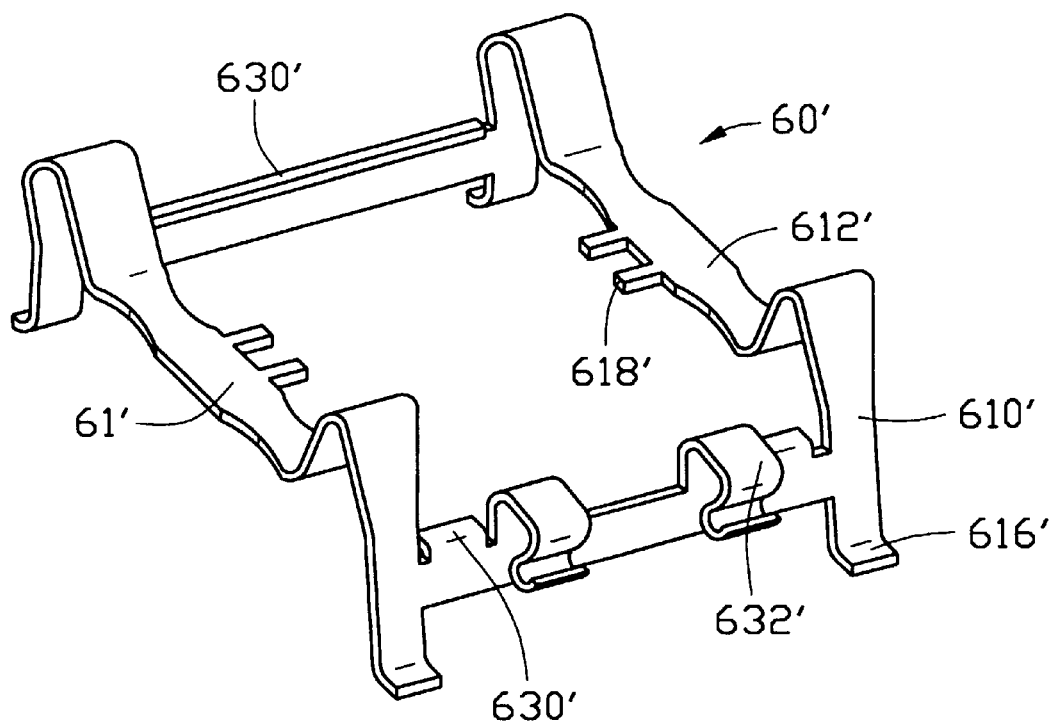
FIG. 9 is a perspective view of a spring clip shown in FIG. 8.

As is clearly shown in FIG. 9, the spring clip 60' of the second embodiment is similar to the spring clip 60 of the first embodiment except that the downwardly extending yoke 618 of the spring clip 60 is replaced by a pair of horizontally and inwardly extending fingers 618', and the one catch 632 is replaced by a pair of catches 632'.

Figure 10:
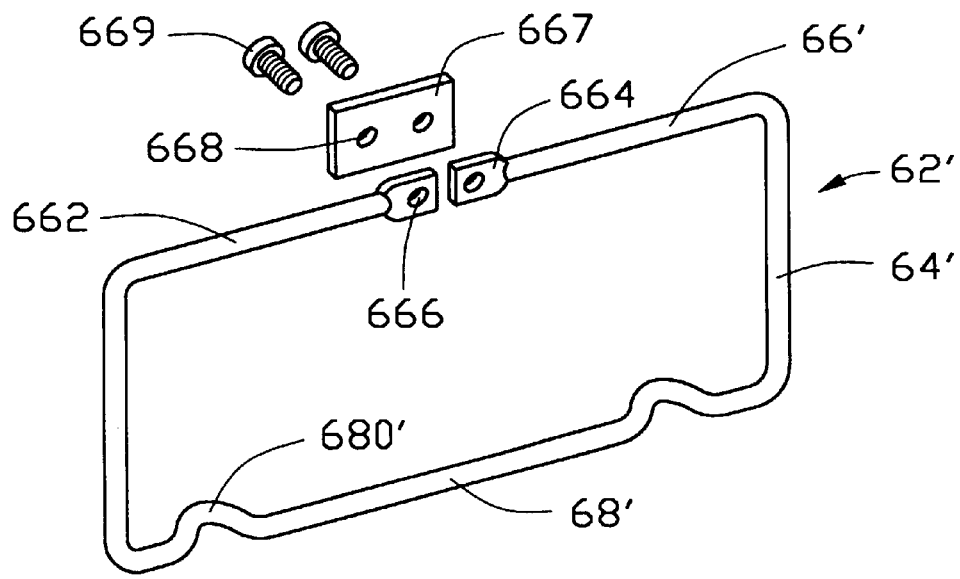
FIG. 10 is a perspective view of a lever shown in FIG. 8.

Referring to FIG. 10, the lever 62' of the second embodiment comprises a pair of opposite lateral beams 64', an actuation beam 68' interconnecting the lateral beams 64', and a handling beam 66' parallel with the actuation beam 68'. A pair of actuation sections 680' is provided by the actuation beam 68'. The handling beam 66' comprises a pair of longitudinal sections 662 respectively extending from free ends of the lateral beams 64' toward each other. Each longitudinal section 662 has an enlarged end 664 defining a threaded hole 666 therein. A tab 667 defining a pair of engaging holes 668 in alignment with corresponding threaded holes 666 of the longitudinal sections 662 is secured to the longitudinal sections 662 by a pair of screws 669 for facilitating handling by a user.

Figure 8:
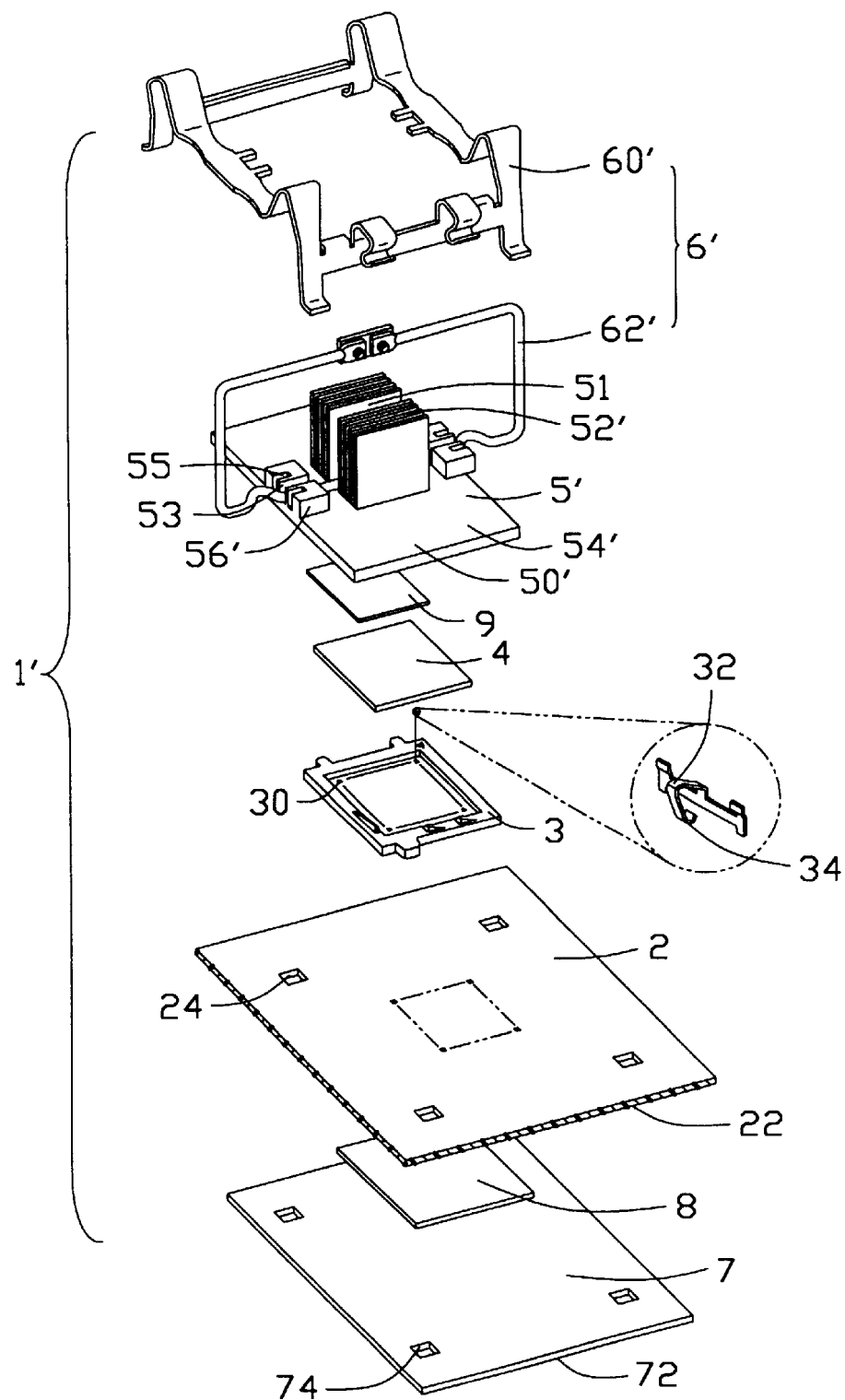
FIG. 8 is an exploded, perspective view of an LGA package assembly in accordance with a second embodiment of the present invention.
Figure 11:
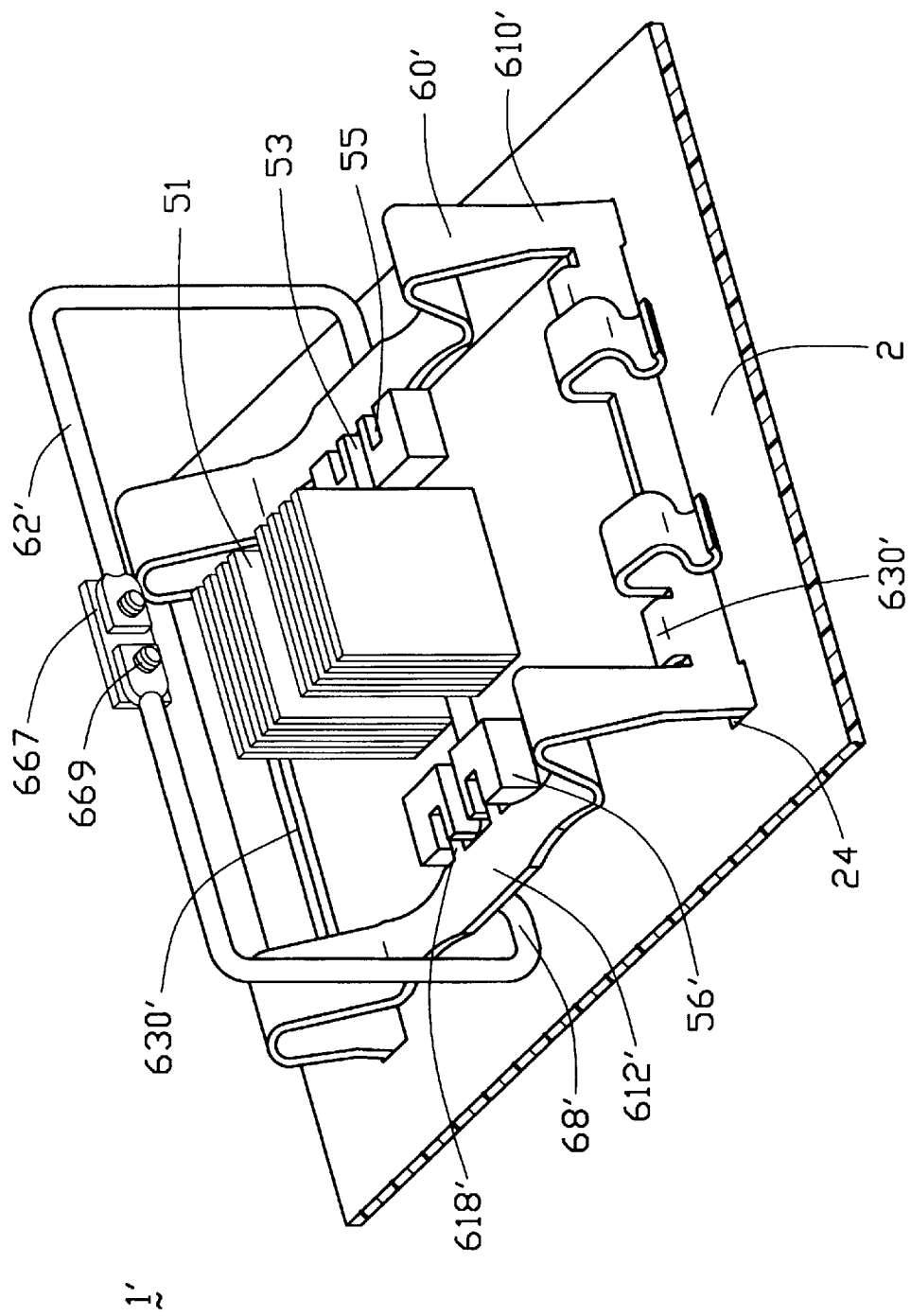
FIG. 11 is an assembled view of the LGA package assembly of FIG. 8 with the lever in a vertical position where the LGA package assembly is in an unlocked position.
Figure 13:
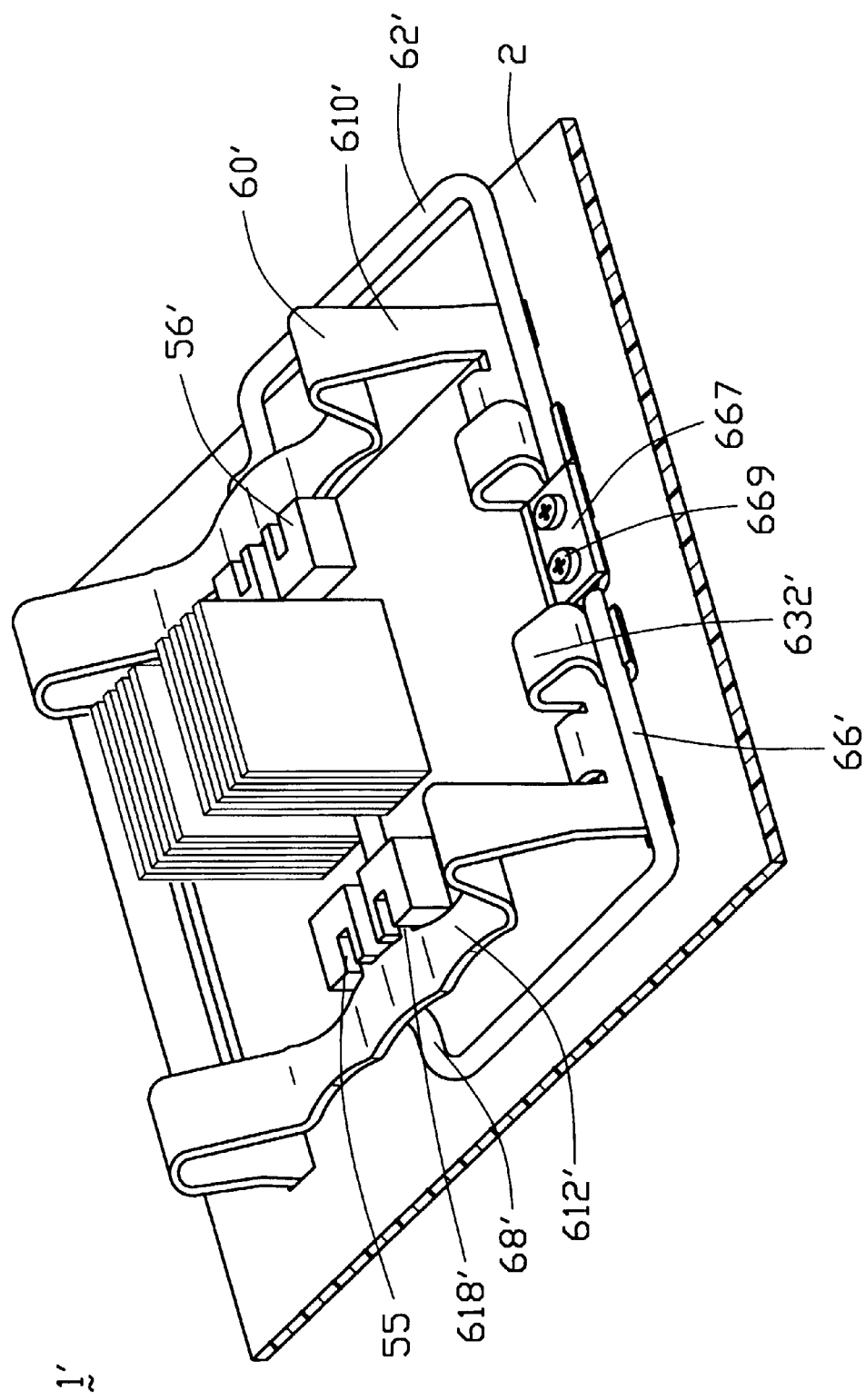
FIG. 13 is an assembled view of the LGA package assembly of FIG. 8 with the lever in a horizontal position where the LGA package assembly is in a locked position.

Referring to FIGS. 8, 11 and 13, corresponding to the configuration of the spring clip 60' and the lever 62', the heat sink 5' defines a central groove 51 within the plurality of fins 52' and forms a pair of spaced protrusions 56' proximate each lateral side thereof. A groove 53 is defined between each pair of protrusions 56' aligned with the central groove 51 for cooperatively receiving the actuation beam 68' of the lever 62'. Each protrusion 56' further defines an upwardly exposed slot 55 proximate the groove 53 for receiving a corresponding finger 618' of the spring clip 60'.

In assembly, the lever 62' is attached to the heat sink 5' in a vertical position with a middle section of the actuation beam 68' thereof received in the aligned grooves 51 and 53 and with the arcuate sections 680' located beside the pair of protrusions 56' and contained in a plane parallel with a substrate 50' of the heat sink 5'. The spring clip 60' is then extended into an inner space defined by the beams 64', 66', 68' with the fingers 618' thereof engaging with corresponding slots 55 of the protrusions 56' and with flanges 630' thereof abutting against a top surface 54' of the substrate 50' of the heat sink 5'. Engaging legs 610' of the spring clip 60' sequentially extend through aligned holes 24 and 74 of the respective PCB 2 and the support plate 7.

Figure 12:
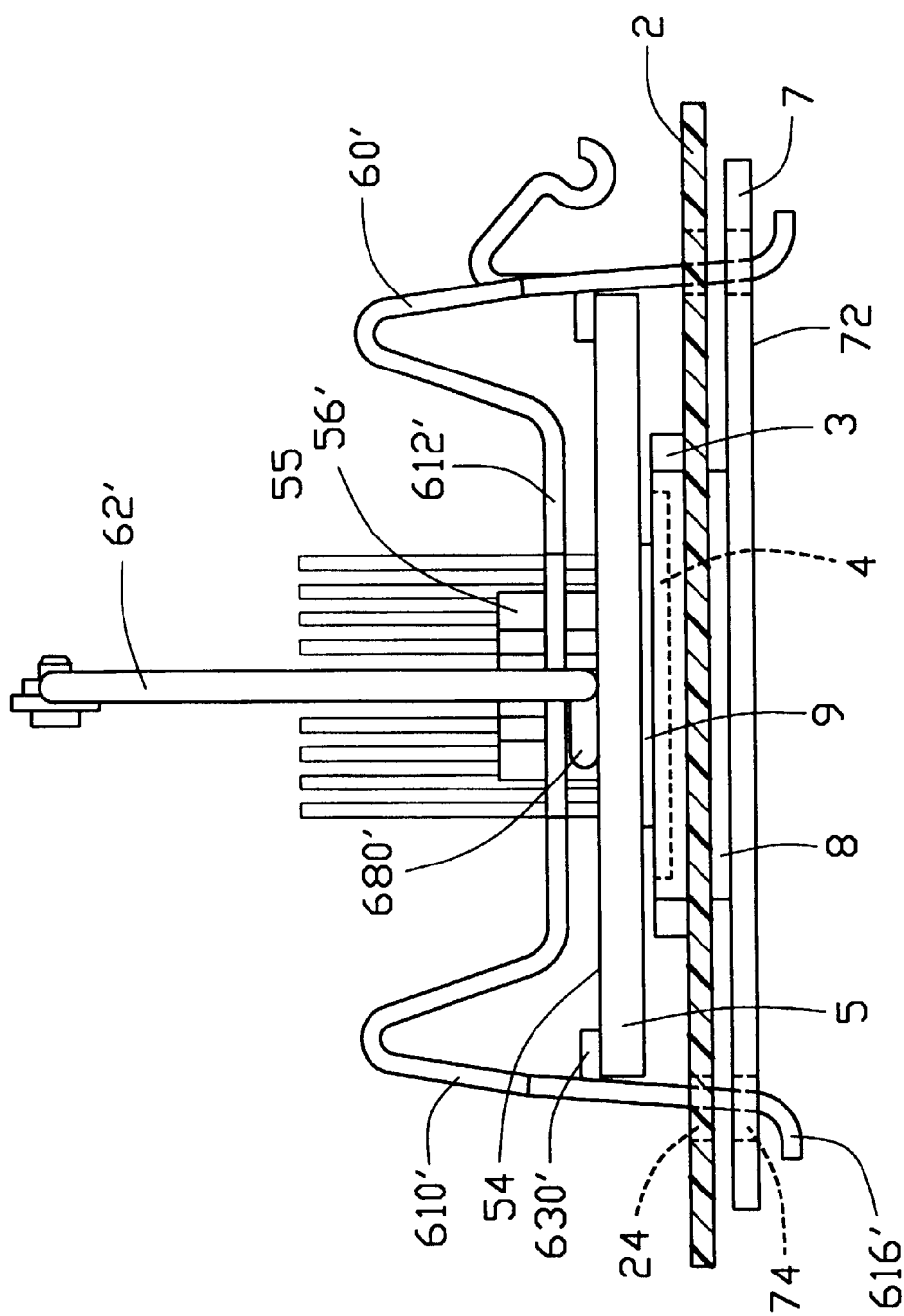
FIG. 12 is a front view of FIG. 11.

FIGS. 11 and 12 show an assembled view of the LGA package assembly 1' of the second embodiment in an unlocked position where the lever 62' is retained in a vertical position. In this unlocked position, the arcuate sections 680' of the actuation beam 68' of the lever 62' are contained in a plane parallel with that of the biasing strips 612' of the spring clip 60', and the engaging toes 616' of the engaging legs 610' of the spring clip 60' project beyond the bottom surface 72 of the support plate 7, whereby the opposite contact portions 32 and 34 of the contacts 30 of the LGA socket 3 are not brought into reliable electrical connection with corresponding contact pads of the LGA package 4 and the PCB 2.

Figure 14:
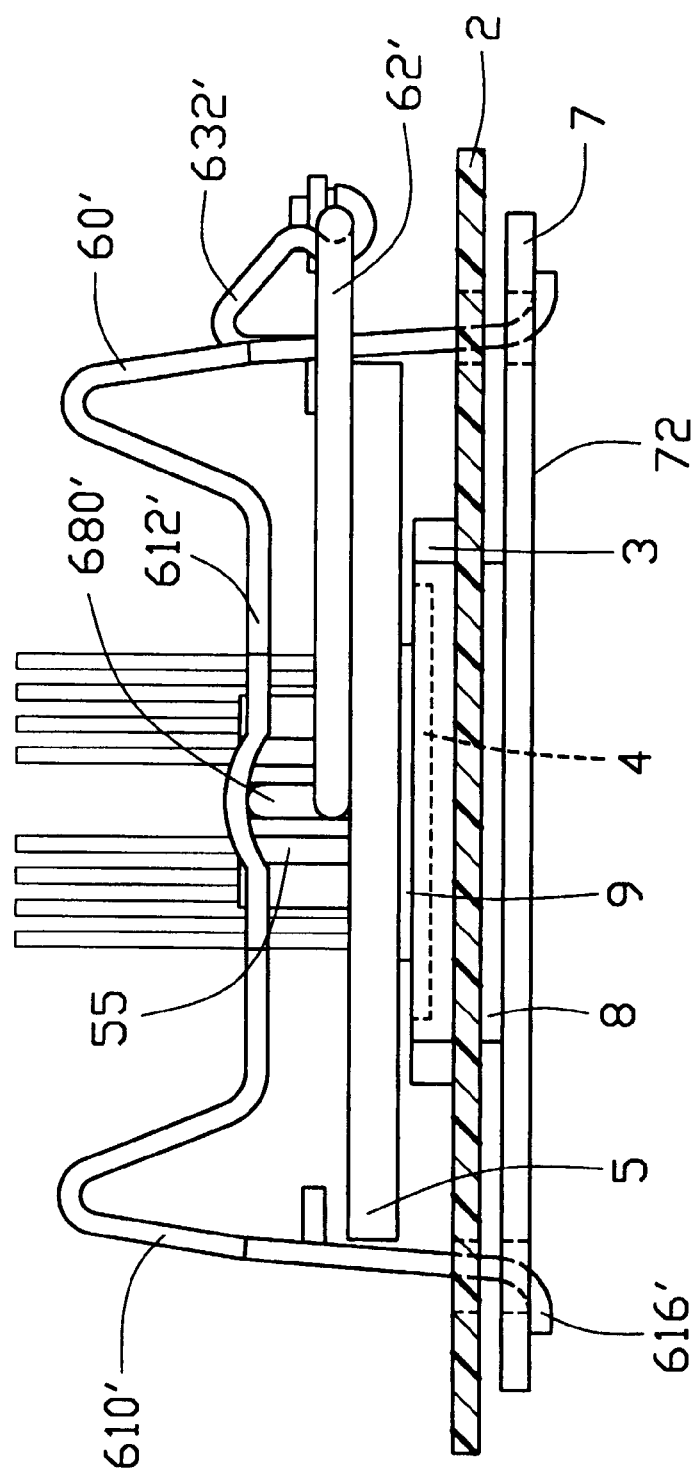
FIG. 14 is a front view of FIG. 13.

FIGS. 13 and 14 show an assembled view of the LGA package assembly 1' of the second embodiment in a locked position where the lever 62' is rotated from the vertical position shown in FIGS. 11 and 12 to a horizontal position. During the rotation process of the lever 62', the slots 55 of the protrusions 56' allow vertical movements of the biasing strips 612' of the spring clip 60'. In the locked position, the arcuate sections 680' of the actuation beam 68' of the lever 62' are contained in a plane perpendicular to that of the biasing strips 612' of the spring clip 60' and engage with the biasing strips 612', whereby the biasing strips 612' are biased upwardly to cause the engaging toes 616' of the engaging legs 610' of the spring clip 60' to abut against the bottom surface 72 of the support plate 7. Consequently, a spring force is exerted by the spring clips 60' on the heat sink 5' via the actuation beams 68' of the lever 62', which is further transferred by the heat sink 5' to the LGA package 4, the LGA socket 3 and the PCB 2, thereby pressing the opposite contact portions 32 and 34 of the contacts 30 of the LGA socket 3 into reliable electrical connection with corresponding contact pads of the LGA package 4 and the PCB 2.

Although the LGA package assembly 1, 1' of the present invention is disclosed to include a retention mechanism 6, 6', a heat sink 5, 5', a pair of elastomers 8 and 9, an LGA package 4, an LGA socket 3, a PCB 2 and a support plate 7, it should be understood that the use of the elastomers 8 and 9 and the support plate 7 are optional. Without these optional elements, the engaging toes 616, 616' of the spring clip 60, 60' will abut against the bottom surface 22 of the PCB 2 rather than the support plate 7. In addition, the spring clip 60, 60' may only include one spring member 61, 61' without departing from the true spirits of the present invention.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An IC (Integrated Circuit) package assembly comprising:

a PCB (Printed Circuit Board) having a plurality of contact pads on a top surface thereof;

a socket mounted on the PCB, the socket receiving a plurality of contacts each having oppositely projecting contact portions;

an IC package coupled to the socket and having a plurality of contact pads on a bottom surface thereof;

a heat sink positioned on the IC package, the heat sink including a planar substrate and a plurality of heat dissipating fins upwardly extending from the substrate; and a retention mechanism for mechanically and electrically assembling the PCB, the socket, the IC package and the heat sink together, the retention mechanism comprising:

a spring clip attached to a top surface of the substrate of the heat sink and disengaged from the heat dissipating fins, the spring clip having a pair of engaging legs and a biasing strip between the pair of engaging legs substantially parallel with the substrate of the heat sink; and a lever having an actuation beam retentively seated on the top surface of the substrate of the heat sink, the actuation beam having an arcuate section located beneath the biasing strip of the spring clip, the lever being rotatable from a first position where the arcuate section is contained in a plane parallel with the biasing strip of the spring clip to a second position where the arcuate section is contained in a plane perpendicular to the biasing strip of the spring clip and engages with the biasing strip of the spring clip;

wherein, when the lever is rotated to the second position to engage with the biasing strip of the spring clip, the biasing strip is biased upwardly to engage the engaging legs of the spring clip with a bottom surface of the PCB, whereby a reliable electrical connection is established between the contact portions of the contacts of the socket and corresponding contact pads of the IC package and the PCB.

2. The IC package assembly as described in claim 1, wherein the first and second positions of the lever are, respectively, vertical and horizontal positions relative to the substrate of the heat sink.

3. The IC package assembly as described in claim 1, wherein the PCB defines a pair of holes therein for extension of corresponding engaging legs of the spring clip therethrough, and wherein the pair of engaging legs of the spring clip forms a pair of respective horizontally extending engaging toes for abutting against the bottom surface of the PCB.

4. The IC package assembly as described in claim 1, wherein the actuation beam of the lever extends in a direction perpendicular to that of the biasing strip of the spring clip.

5. The IC package assembly as described in claim 1, wherein the biasing strip of the spring clip has opposite ends thereof connected with corresponding engaging legs via a pair of bent portions having a reversed U-shape.

6. The IC package assembly as described in claim 1, wherein the substrate of the heat sink forms a first pair and a second pair of spaced protrusions on a top surface thereof, the first and second pairs of spaced protrusions defining a space therebetween for accommodating the arcuate section of the actuation beam of the lever while opposite ends of the actuation beam of the lever are received within the respective first and second pairs of spaced protrusions.

7. The IC package assembly as described in claim 6, wherein the spring clip has a downwardly extending yoke loosely received in an engaging aperture defined in the substrate of the heat sink proximate one of the first and second pairs of the protrusions, and wherein a free end section of the actuation beam of the lever extends through the yoke.

8. The IC package assembly as described in claim 1, wherein the substrate of the heat sink forms a pair of protrusions defining a groove therebetween for receiving the actuation beam of the lever while the arcuate section of the lever is located beside the protrusions.

9. The IC package assembly as described in claim 8, wherein each protrusion of the heat sink defines an upwardly exposed slot proximate the groove, and wherein the biasing strip of the spring clip forms a pair of projected fingers for being received in corresponding slots.

10. The IC package assembly as described in claim 1, wherein the lever comprises a handling beam opposite to the actuation beam for facilitating handling by a user, and wherein the spring clip forms a catch for receiving the handling beam of the lever when the lever is retained in the second position.

11. The IC package assembly as described in claim 1, further comprising a metal support plate attached to the bottom surface of the PCB for strengthening the PCB, the support plate defining holes aligned with corresponding holes of the PCB for extension of the engaging legs of the spring clip therethrough.

12. The IC package assembly as described in claim 11, further comprising an elastomer sandwiched between the PCB and the support plate and also between the IC package and the heat sink.

13. An IC (Integrated Circuit) package assembly comprising:

a PCB (Printed Circuit Board) having a plurality of contact pads on a top surface thereof;

a socket mounted on the PCB, the socket receiving a plurality of contacts each having oppositely projecting contact portions;

an IC package coupled to the socket and having a plurality of contact pads on a bottom surface thereof;

a heat sink positioned on the IC package, the heat sink including a planar substrate and a plurality of heat dissipating fins upwardly extending from the substrate; and a retention mechanism for mechanically and electrically assembling the PCB, the socket, the IC package and the heat sink together, the retention mechanism comprising:

a spring clip attached to a top surface of the substrate of the heat sink and disengaged from the heat dissipating fins, the spring clip having a pair of engaging legs and a biasing strip between the engaging legs substantially parallel with the substrate of the heat sink; and a lever having an actuation beam retentively seated on the top surface of the substrate of the heat sink beneath the biasing strip of the spring clip, the lever being rotatable from a vertical position where the actuation beam is disengaged from the biasing strip of the spring clip to a horizontal position where the actuation beam is engaged with the biasing strip of the spring clip;

wherein, when the lever is rotated to the horizontal position to engage the actuation beam thereof with the biasing strip of the spring clip, the engaging legs of the spring clip are actuated to press against a bottom surface of the PCB, whereby a reliable electrical connection is established between the opposite contact portions of the contacts of the socket and corresponding contact pads of the IC package and the PCB.

14. The IC package assembly as described in claim 13, wherein the actuation beam of the lever includes an arcuate section, the arcuate section being contained in a plane parallel with the biasing strip of the spring clip when the lever is in the vertical position and being contained in a plane perpendicular to the biasing strip of the spring clip when the lever is in the horizontal position.

15. The IC package assembly as described in claim 13, wherein the PCB defines a pair of holes therein for extension of corresponding engaging legs of the spring clip therethrough, and wherein the pair of engaging legs of the spring clip forms a pair of respective horizontally extending engaging toes for abutting against the bottom surface of the PCB.

16. The IC package assembly as described in claim 13, wherein the actuation beam of the lever extends in a direction perpendicular to that of the biasing strip of the spring clip.

17. The IC package assembly as described in claim 13, wherein the biasing strip of the spring clip has opposite ends thereof connected with corresponding engaging legs via a pair of bent portions having a reversed U-shape.

18. The IC package assembly as described in claim 13, wherein the lever comprises a handling beam opposite to the actuation beam for facilitating handling by a user, and wherein the spring clip forms a catch for receiving the handling beam of the lever when the lever is retained in the horizontal position.

19. A retention mechanism for mechanically and electrically assembling a PCB (Printed Circuit Board), a socket, an IC (Integrated Circuit) package and a heat sink which are arranged in order, the retention mechanism comprising:

a spring clip for being attached to the heat sink, the spring clip having a pair of engaging legs and a biasing strip between the engaging legs, the biasing strip having a downwardly extending yoke and being connected with the engaging legs by a pair of bent portions; and a lever having an actuation beam adapted for being attached to the heat sink, the actuation beam having an arcuate section located beneath the biasing strip of the spring clip and a free end section extending through and vertically movable in the yoke of the spring clip, the lever being rotatable from a first position where the arcuate section is contained in a plane parallel with the biasing strip of the spring clip to a second position where the arcuate section is contained in a plane perpendicular to the biasing strip of the spring clip and engages with the biasing strip of the spring clip;

wherein, when the lever is rotated to the second position to engage with the biasing strip of the spring clip, the biasing strip is biased upwardly to engage the engaging legs of the spring clip with a bottom surface of the PCB, whereby the heat sink, the IC package, the socket and the PCB are securely attached together and a reliable electrical connection is established between the IC package and the PCB via the socket.

20. A retention mechanism assembly comprising:

a spring clip defining a pair of downwardly extending engaging legs with engaging toes thereof and a biasing strip between the engaging legs;

a PCB (Printed Circuit Board) positioned under said spring clip with means for latchable engagement with said engaging toes of said engaging legs;

a heat sink positioned between said PCB and the biasing strip, said heat sink having a substrate facing said PCB; and a lever moveably located around said spring clip and said heat sink, said lever including an actuation beam retained to and seated upon a top face of the substrate of said heat sink, and an actuation section which, when said lever is operated at a first position, said actuation section is spaced from a bottom face of said biasing strip so as to form a non-tension condition of the assembly with the engaging toes not latchably engaging the means of the PCB, and when said lever is operated at a second position, said actuation section is engaged with the bottom face of said biasing strip so as to form a tension condition of the assembly with the engaging toes latchably engaging the means of said PCB; wherein a latch of the lever rests on a catch of the spring clip when said lever is operated at the second position.

21. The assembly as described in claim 20, wherein said lever is rotatable between said first position and said second position around a central axis of the actuation beam.

22. The assembly as described in claim 21, wherein said spring clip and said heat sink are restrained not to move relative to each other in a front-to-back direction parallel to a direction between said first and second positions, by means of either direct engagement between the clip and the heat sink or through said lever being retained to both the clip and the heat sink.

23. The assembly as described in claim 20, wherein said spring clip provides at least one flange abutting against the top face of said heat sink when said clip is in a non-tension condition.

* * * * *